United States Patent
Pavlovic

(10) Patent No.: US 10,735,012 B2
(45) Date of Patent: Aug. 4, 2020

(54) DIGITALLY CONTROLLED OSCILLATOR

(71) Applicant: NXP B.V.

(72) Inventor: Nenad Pavlovic, Eindhoven (NL)

(73) Assignee: NXP B.V., Eindhoven (NL)

(*) Notice: Subject to any disclaimer, the term of this patent is extended or adjusted under 35 U.S.C. 154(b) by 328 days.

(21) Appl. No.: 15/849,683

(22) Filed: Dec. 21, 2017

(65) Prior Publication Data

US 2018/0191364 A1    Jul. 5, 2018

(30) Foreign Application Priority Data

Dec. 30, 2016  (EP) .................................. 16207639

(51) Int. Cl.
*H03M 1/08*      (2006.01)
*G01S 7/35*      (2006.01)
(Continued)

(52) U.S. Cl.
CPC ........... *H03M 1/0854* (2013.01); *G01S 7/032* (2013.01); *G01S 7/35* (2013.01); *G01S 13/343* (2013.01); *H03K 3/0231* (2013.01); *H03L 7/099* (2013.01); *H03L 7/0991* (2013.01); *H03L 7/197* (2013.01); *H03L 2207/06* (2013.01)

(58) Field of Classification Search
CPC ...... G01S 7/032; G01S 13/343; G01S 13/345; H03M 1/00; H03M 1/06; H03M 1/08; H03M 1/0836; H03M 1/0854; H03K 3/00; H03K 3/02; H03K 3/0231; H03K 3/03; H03L 7/0814; H03L 7/099; H03L 7/0991; H03B 19/00; H03B 19/05
See application file for complete search history.

(56) References Cited

U.S. PATENT DOCUMENTS 4,503,433 A  *  3/1985 Tomasi .................. G01S 13/343
                                                   342/124
7,215,276 B2   5/2007 Batten et al.
(Continued)

FOREIGN PATENT DOCUMENTS

EP        1884019 A       1/2013
EP        2 993 788 B2    3/2016
(Continued)

OTHER PUBLICATIONS

Hsu, C.-M. et al. "A Low-Noise Wide-BW 3.6-GHz Digital SD Fractional-N Frequency Synthesizer With a Noise-Shaping Time-to-Digital Converter and Quantization Noise Cancellation",IEEE Journal of Solid-State Circuits, vol. 43, No. 12, pp. 2776-2786 (Dec. 2008).

*Primary Examiner* — Peter M Bythrow
(74) *Attorney, Agent, or Firm* — Rajeev Madnawat

(57) ABSTRACT

A digitally controlled oscillator comprising a filtering digital to analogue converter, DAC, component and a voltage controlled oscillator, VCO, component comprising at least one control terminal arranged to receive a control voltage output by the DAC component; wherein the DAC component comprises a voltage generation component arranged to generate the control voltage and at least one configurable capacitive load component to which the control voltage is applied such that a filtering bandwidth of the DAC component is configurable by way of the at least one configurable capacitive load component.

13 Claims, 4 Drawing Sheets

(51) Int. Cl.
*H03L 7/099* (2006.01)
*H03K 3/0231* (2006.01)
*G01S 13/34* (2006.01)
*H03L 7/197* (2006.01)
*G01S 7/03* (2006.01)

(56) References Cited

U.S. PATENT DOCUMENTS

| | | | |
|---|---|---|---|
| 7,259,633 B2 | 8/2007 | Lee et al. | |
| 9,490,745 B1* | 11/2016 | Toso | H03B 5/1212 |
| 9,584,177 B2 | 2/2017 | Pavlovic et al. | |
| 10,191,453 B2 | 1/2019 | Pavlovic et al. | |
| 2003/0227336 A1* | 12/2003 | Wang | H03B 5/1231 |
| | | | 331/100 |
| 2005/0248413 A1 | 11/2005 | Zhu et al. | |
| 2007/0182502 A1* | 8/2007 | Shin | H03B 5/1228 |
| | | | 331/167 |
| 2008/0164955 A1* | 7/2008 | Pfeiffer | H03B 5/1231 |
| | | | 331/117 R |
| 2008/0266005 A1* | 10/2008 | Jacobsson | H03J 3/32 |
| | | | 331/108 A |
| 2010/0245160 A1* | 9/2010 | Sakurai | G01S 7/4008 |
| | | | 342/200 |
| 2011/0025386 A1 | 2/2011 | Lamanna et al. | |
| 2012/0049913 A1 | 3/2012 | Tadjpour | |
| 2012/0319889 A1* | 12/2012 | Kobayashi | G01S 7/4008 |
| | | | 342/118 |
| 2013/0050013 A1* | 2/2013 | Kobayashi | G01S 13/343 |
| | | | 342/118 |
| 2013/0135057 A1* | 5/2013 | Roithmeier | H03B 5/1284 |
| | | | 331/117 FE |
| 2014/0062610 A1* | 3/2014 | Ito | H03K 3/0231 |
| | | | 331/186 |
| 2014/0312981 A1* | 10/2014 | Nakamura | H03L 7/02 |
| | | | 331/34 |
| 2017/0047890 A1* | 2/2017 | Lin | H03B 5/1212 |
| 2017/0285139 A1* | 10/2017 | Higuchi | G01S 7/40 |
| 2019/0158022 A1* | 5/2019 | Issakov | H03B 5/1296 |

FOREIGN PATENT DOCUMENTS

| | | |
|---|---|---|
| EP | 3 059 866 A1 | 8/2016 |
| WO | 2006/127102 A2 | 11/2006 |
| WO | 2016/015673 A1 | 2/2016 |

* cited by examiner

DIGITALLY CONTROLLED OSCILLATOR

CROSS-REFERENCE TO RELATED APPLICATIONS

This application claims the priority under 35 U.S.C. § 119 of European Patent application no. 16207639.2, filed on Dec. 30, 2016, the contents of which are incorporated by reference herein.

FIELD OF THE INVENTION

This invention relates to a digitally controlled oscillator, and in particular a digitally controlled oscillator for use within a phase-locked loop arranged to generate a chirp signal for use within a frequency-modulated continuous-wave radar system.

BACKGROUND OF THE INVENTION

Frequency modulated continuous-wave (FMCW) radar systems, such as those used in automotive applications, require a low noise chirp signal with a highly linear variation in frequency with respect to time because the frequency of the detected return signal is used to infer distance. For accurate distance resolution, a high degree of accuracy in the frequency output from the chirp generator is required. In addition, a fast settling time between each chirp phase is required.

It desirable for such FMCW radar systems to be implemented within CMOS deep-submicron process semiconductor devices. However, SiGeCmos process semiconductor devices have a 5V supply advantage compared to the 1V supply used in CMOS deep-submicron process devices. Accordingly, for the same chirp dynamic range, the oscillator gain in a CMOS deep-submicron process device is required to be five times larger, with the DAC noise contribution also being increased.

SUMMARY OF THE INVENTION

The present invention provides a digitally controlled oscillator, phase-locked loop and frequency-modulated continuous-wave radar system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a simplified block diagram of an example embodiment of a phase-locked loop arranged to generate a chirp signal for use within, for example, a frequency modulated continuous-wave (FMCW) radar system or the like.

DETAILED DESCRIPTION OF THE PREFERRED EMBODIMENTS

The present invention will now be described with reference to the accompanying drawings in which there are illustrated example embodiments of the present invention. However, it will be appreciated that the present invention is not limited to the specific examples herein described and as illustrated in the accompanying drawings, and various modifications and alternative implementations are contemplated without departing from the inventive concept.

In accordance with example embodiments there is provided a digitally controlled oscillator comprising a filtering digital to analogue converter (DAC) component and a voltage controlled oscillator (VCO) component comprising one or more control terminal(s) arranged to receive a control voltage output by the DAC component. The DAC component comprises a voltage generation component arranged to generate the control voltage and one or more configurable capacitive load component(s) to which the control voltage is applied such that a filtering bandwidth of the DAC component is configurable by way of the configurable capacitive load component(s).

Advantageously, by providing such a configurable capacitive load component, the filtering bandwidth of the DAC component may be configured to have a narrow bandwidth to reduce the DAC noise during, for example, a chirp phase of a chirp signal being generated by the digitally controlled oscillator, and reconfigured to have a broader bandwidth to reduce DAC settling time during a reset phase of the chirp signal.

Figure 1:
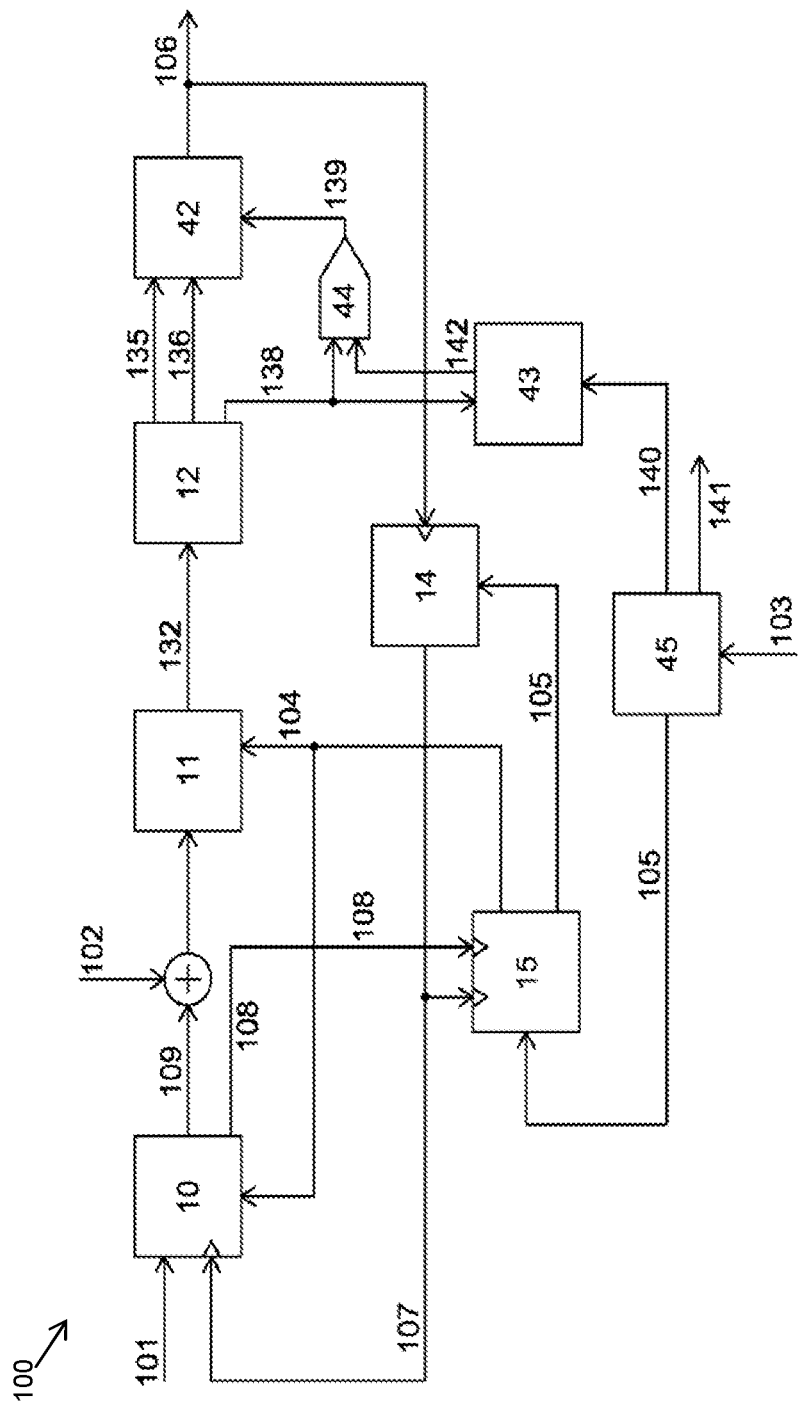

Referring first to FIG. 1 there is illustrated a simplified block diagram of an example embodiment of a phase-locked loop (PLL) 100 comprising such a digitally controlled oscillator and arranged to generate a chirp signal for use within, for example, a frequency modulated continuous-wave (FMCW) radar system or the like, such as may be used in automotive applications. Accordingly, it is contemplated that the PLL illustrated in FIG. 1 may be implemented within, for example, a long range radar (LRR) system, a medium range radar (MRR) system, a short range radar (SRR) system, an ultra-short SRR system, or the like.

In the example embodiment illustrated in FIG. 1, the PLL comprises a predominantly digital implementation comprising a time to digital converter (TDC) 10, quantisation noise cancelling block 11, digital loop filter 12, frequency controlled oscillator 42, frequency divider 14, divider control 15, chirp control block 45, look up table 43 and digital to analogue converter (DAC) 44.

Such a PLL is disclosed in the Applicant's co-pending U.S. patent application published under number US2016241301, and incorporated herein by reference. Accordingly, the operation of the PLL 100 illustrated in Figure need not be described in detail. However for completeness, a clock reference input 101 and an input signal 107 is provided to the TDC 10. The TDC 10 may be a successive approximation register (SAR) TDC, but this is not essential and any TDC architecture may be used. The TDC 10 determines the time difference between the clock reference input 101 and the input signal 107. The input signal 107 is the output from the frequency divider 14. The frequency divider 14 receives the frequency controlled oscillator 42 output 106 (which is the output of the phase locked loop) and divides the frequency thereof, so that a relatively low frequency reference clock input 101 may be used to generate a relatively high frequency output signal 106 with precision. The frequency divider 14 is controlled by the divider control block 15, which may comprise a sigma-delta modulator, so that the divider 14 and control block 15 together provide for fractional frequency dividing.

The divider control block 15 provides a divider value 105 to the divider block 14 and an accumulated sigma-delta error 104 to the quantisation noise cancelling block 11. The divider control block 15 is configured to receive the divider value from the chirp control block 45. The divider control block 15 receives a re-clocked reference signal 108 from the SAR TDC 10 and the frequency divided DCO signal output by the divider block 14.

The chirp control block 45 receives a normalised tuning word (NTVV) 103 and controls the operation of the divider control block 15 and the operating mode of the phase locked loop.

A normalised TDC output 109 from the TDC 10 is provided to the quantisation noise cancelled block 11, after the addition of a phase offset signal 102. The quantisation noise cancelling block 11 is configured to reduce divider quantisation noise. The quantisation noise cancelling block 11 may be configured to cancel or reduce noise in the digital domain.

The output 132 of the quantisation noise cancelling block 11 is the phase error 132, which is provided to the digital loop filter 12. The digital loop filter 12 is configured to convert the phase error input signal 132 into a digital output for controlling the frequency controlled oscillator 42 so as to minimise the phase error 132.

The frequency controlled oscillator 42 has a first control input, comprising a tracking input 135 and an acquisition input 136 and a second control input 139 (or frequency modulation input). The first control input comprises digital inputs. Each of the tracking input 135 and acquisition input 136 may be associated with a switched capacitor varactor bank, which are used to vary the frequency of the oscillator 42. The second control input 139 may be an analogue input, and may be associated with an analogue varactor. The use of an analogue varactor allows filtering of quantisation noise prior to this control input, which improves the linearity of a chirp produced using the phase locked loop 100.

The DAC COMPONENT 44 is connected to the second control input 139 of the frequency controlled oscillator 42. The DAC COMPONENT 44 receives a digital input 142, 138 from the look up table 43 or digital loop filter 12.

The chirp generator 45 is configured to control the operation of the phase locked loop, providing the divider value 105 to the divider control block 15, a frequency modulation control signal 42 to the look up table 43 and a chirp window output signal 141. The chirp generator 45 is configured to control the phase locked loop in response to the normalised tuning word 103 input.

The look up table (LUT) 43 is configured to receive the frequency modulation control signal 42 from the chirp generator 45. The LUT 43 is further configured to receive an output 138 from the loop filter 12 and to provide a digital output 142 to the DAC COMPONENT 44 so as to provide the second control input 139 to the frequency controlled oscillator 42. The LUT 43 comprises a memory for storing digital control values and, optionally, an associated chirp frequency value.

In a chirp mode of operation, the DAC COMPONENT 44 is responsive to the digital output 142 from the LUT 43. The LUT 43 receives a frequency modulation control signal 42 from the chirp control block 45 corresponding with a desired chirp frequency, and outputs a digital signal 142 determined with reference to the list of digital control values in the memory. For instance, if the desired frequency corresponds exactly with one of the calibration frequencies, the stored value may be used directly. Interpolation (e.g. linear, cubic, spline, polynomial etc) may be used to determine digital control values 142 for intermediate desired frequencies 42 that do not correspond exactly with calibration frequencies of control values stored in the LUT memory.

In the chirp mode of operation, the chirp control block 45 provides a divider value 105 to the divider control block 15 that removes the effect of the second control input 139 of the frequency controlled oscillator 42. In this way, the first control input 135, 136 of the frequency controlled oscillator 42 maintains locked during the rapid chirp frequency sweeps, while compensating for any distortion caused by non-linearity.

As previously mentioned, the PLL 100 illustrated in FIG. 1 comprises a DAC-VCO arrangement in which the DAC 44 comprises a voltage generation component arranged to generate the control voltage 139 and one or more configurable capacitive load component(s) to which the control voltage is applied such that a filtering bandwidth of the DAC 44 is configurable by way of the configurable capacitive load component(s). "A Low-Noise Wide-BW 3.6-GHz Digital SD Fractional-N Frequency Synthesizer With a Noise-Shaping Time-to-Digital Converter and Quantization Noise Cancellation"; C.-M. Hsu, M. Z. Straayer, and M. H. Perrott, IEEE Journal of Solid-State Circuits, vol. 43, no. 12, pp. 2776-2786, December 2008, (hereinafter referred to as "Hsu et al") describes a digital frequency synthesizer comprising a DAC-VCO implementation, and accordingly is incorporated herein in its entirety.

Figure 2:
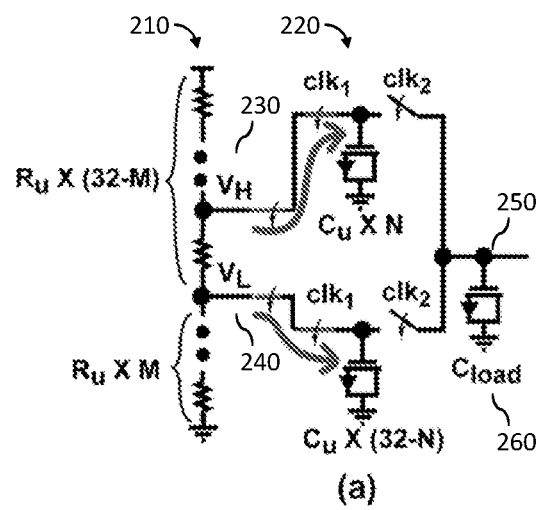
FIG. 2 illustrates simplified circuit diagrams of a passive DAC.
Figure 2:
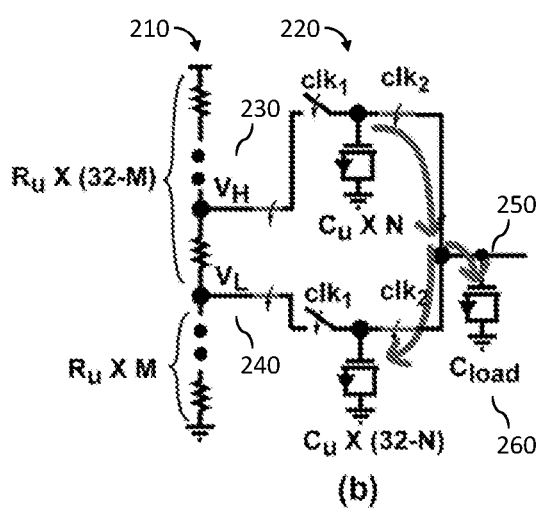

Hsu et al proposes the combination of a passive DAC and VCO in place of a more sophisticated and complex digitally controlled oscillator (DCO), thereby avoiding the need for a high resolution switched capacitor network which can require a prohibitively large design effort to achieve good performance. FIG. 2 illustrates simplified circuit diagrams of the passive DAC proposed in Hsu et al, which performs a two-step conversion process using a combination of a 5-bit resistor ladder 210 with a 5-bit capacitor array 220 to convert a 10-bit digital control word into a voltage control signal. In a first step, as illustrated in the circuit diagram FIG. 2(a), the resistor ladder 210 is used to form two voltages of value $V_H$ 230 and $V_L$ 240. Simultaneously, the first voltage $V_H$ 230 is connected to N unit cell capacitors ($C_u$) within the capacitor array 220 and the second voltage $V_L$ 240 is connected to (32-N) unit cell capacitors ($C_u$) within the capacitor array 220, where N ranged from 0 to 31. In a second step, as illustrated in the circuit diagram FIG. 2(b), the capacitors 220 are first disconnected from the resistor ladder 210, and then connected to an output node 250 coupled to a load capacitor $C_{LOAD}$ 260. The output node 250 of the DAC circuit illustrated in FIG. 2 may then be coupled to a VCO control terminal.

Thus, Hsu et al discloses a DAC comprising passive resistance-capacitance (RC) voltage generation component comprising a resistance network and a capacitive array component arranged to perform a two-step conversion process to convert a digital control signal into an output voltage applied to the output node 250 coupled to a load capacitor $C_{LOAD}$ 260. As outlined in Hsu et al, this two-step combination repeated at a frequency $f_s$ achieves a first-order filtering with cut-off frequency $f_o$ defined by:

$$f_0 = \frac{32 \cdot C_u}{(2\pi \cdot C_{LOAD})} \cdot f_s \qquad \text{Equation 1}$$

From Equation 1, it can be seen that the filtering bandwidth of the DAC can be configured by proper selection of the capacitor value for the load capacitor $C_{LOAD}$ 260.

Figure 3:
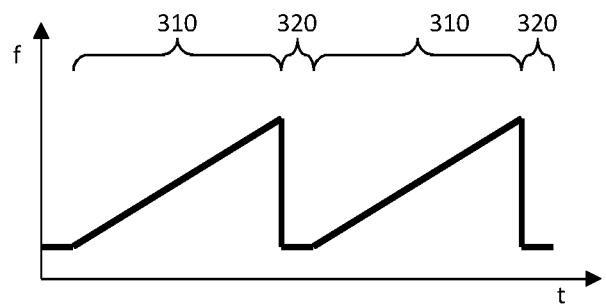
FIG. 3 illustrates a simplified graph of frequency over time illustrating an example of a chirp signal required by FMCW radar systems.

FIG. 3 illustrates a simplified graph of frequency over time illustrating an example of a chirp signal required by FMCW radar systems. As illustrated in FIG. 3, the chirp signal comprises a chirp phase 310 followed by a reset phase 320. During the chirp phase 310, the chirp signal is required to increase linearly in frequency from a starting frequency to a final frequency. During the reset phase 320, the chirp signal is required to return (reset) to the starting frequency.

FMCW radar systems require a highly linear, low noise chirp signal. Accordingly, during a chirp phase 310, the load capacitor $C_{LOAD}$ 260 of the DAC circuit illustrated in FIG. 2 may be selected to achieve the required (narrow) bandwidth filtering of DAC thermal and quantization noise. However, the large capacitive value of the load capacitor $C_{LOAD}$ 260 that would achieve the required narrow bandwidth filtering would increase the time required to discharge the load capacitor $C_{LOAD}$ 260 during the reset phase 320 to return the chirp signal to the starting frequency, thereby excessively increasing the settling time of the chirp signal during the reset phase 320. However, selecting the load capacitor $C_{LOAD}$ 260 of the DAC circuit illustrated in FIG. 2 to achieve an acceptable settling time of the chirp signal during the reset phase 320 would not achieve a sufficiently narrow bandwidth filtering to ensure a low phase noise during the chirp phase 310.

Figure 4:
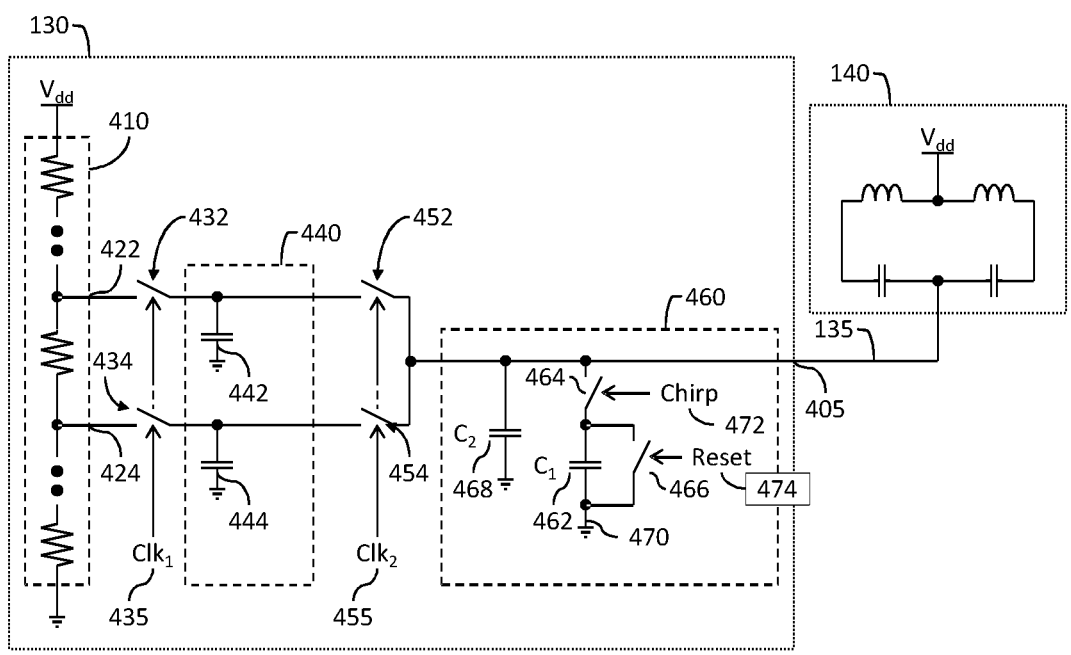
FIG. 4 schematically illustrates a simplified circuit diagram of an example embodiment of a DAC component.

Referring now to FIG. 4, there is schematically illustrated a simplified circuit diagram of an example embodiment of the DAC component 44 of FIG. 1 arranged to receive a digital control signal 138, 142 and to convert the received digital control signal into a voltage control signal 139 provided to a control terminal of the VCO 42.

In the example illustrated in FIG. 4, the DAC component 44 illustrated in FIG. 4 comprises a voltage generation component comprising an RC network similar to that disclosed in Hsu et al. Specifically for the illustrated embodiment, the voltage generation component comprises a resistor network 410, for example comprising a resistor ladder, arranged to convert a digital control signal received by the DAC component 44, such as the digital control signal 138, 142 illustrated in FIG. 1, into one or more voltage values at internal nodes of the DAC component 44. In particular for the illustrated example, the resistance network 410 is arranged to convert the digital control signal 138, 142 into a first voltage value at a first internal node 422 and a second voltage value at a second internal node 424.

The voltage generation component illustrated in FIG. 4 further comprises a capacitive array component 440 comprising one or more array capacitances. In particular for the illustrated example, the capacitive array component 440 illustrated in FIG. 4 comprises a first array capacitance 442 and a second array capacitance 444.

A first switching array is arranged to couple the capacitive array component 440 to the resistor network 410. In the illustrated example, the first switching array comprises a first switch 432 controllable by a first timing signal ($Clk_1$) 435 to couple the first array capacitance 442 to the first internal node 422 of the DAC component 44 and a second switch 434 controllable by the first timing signal ($Clk_1$) 435 to couple the second array capacitance 444 to the second internal node 424 of the DAC component 44.

A second switching array is arranged to couple the capacitive array component 440 to an output node 405 of the voltage generation component. In the illustrated example, the second switching array comprises a first switch 452 controllable by a second timing signal ($Clk_2$) 455 to couple the first array capacitance 442 to the output node 405 of the voltage generation component and a second switch 454 controllable by the second timing signal ($Clk_2$) 455 to couple the second array capacitance 444 to the output node 405 of the voltage generation component. The first and second timing signals ($Clk_1$) 435, ($Clk_2$) 455 are arranged to cause the first and second switching arrays to alternate between coupling the array capacitances 442, 444 to the internal nodes 422, 424 of the DAC component 44 and the output node 405 of the voltage generation component. For example, in some embodiments, the first and second timing signals ($Clk_1$) 435, ($Clk_2$) 455 may comprise opposing, non-overlapping clock signals.

The DAC component 44 further comprises a capacitive load component 460 coupled to the output node 405 of the voltage generation component.

It is to be appreciated that the voltage generation component illustrated in FIG. 4 is provided as an example implementation of the voltage generation component, and is not intended to be limiting to the scope of the invention.

As for the passive DAC proposed in Hsu et al, the voltage generation component illustrated in FIG. 4 performs a two-step conversion process using a combination of the resistor network 410 with the capacitive array component 440 to generate a voltage at the output node 405 of voltage generation component. The operation of such a voltage generation component is described in detail in Hsu et al, and thus will not be described in greater detail herein.

As described above, such a two-step combination repeated at a frequency $f_s$ achieves a first-order filtering bandwidth of the DAC component 44 that can be configured by way of the capacitive value for the load capacitance. In the example embodiment illustrated in FIG. 4, the configurable capacitive load component 460 comprises a decouplable capacitance 462 comprising a first terminal coupled to a reference voltage node 470 and a coupling switch 464 coupled in series with the decouplable capacitance 462 between the output node 405 of the voltage generation component and a second terminal of the decouplable capacitance 462. The coupling switch 464 is controllable via a first control signal 472 to selectively couple the output node 405 of the voltage generation component to the second terminal of the decouplable capacitance 462 and the control terminal of the VCO component 42. In this manner, the capacitive load at the output node 405 of the voltage generation component, and thus the filtering bandwidth of the DAC component 44, is configurable by coupling or decoupling of the decouplable capacitance 462 to the output node 405 of the voltage generation component by the coupling switch 464.

In the example illustrated in FIG. 4, the configurable capacitive load component 460 further comprises a discharge switch 466 coupled in parallel with the decoupling capacitance 462. The discharge switch 466 is controllable via a second control signal 474 to selectively create a discharge path between the first and second terminals of the decouplable capacitance. In this manner, the decouplable capacitance 462 may be rapidly discharged through the discharge switch 466, for example during a reset phase of a chirp signal.

Thus, during a chirp phase 310 of the PLL 100 illustrated in FIG. 1, the first control signal 472 may be set to close the coupling switch 464 to couple the decoupling capacitance 462 to the output node 405 of the voltage generation component and the second control signal 474 may be set to open discharge switch 466. In this manner, during the chirp phase 310 of the PLL 100, the decouplable capacitance 462 is coupled to the output node 405 of the voltage generation component, and thus contributes to the load capacitance at the output node 405. In the example illustrated in FIG. 4, the configurable capacitive load component 460 further comprises a fixed capacitance 468 comprising a first terminal coupled to the reference voltage node 470 and a second terminal coupled to the output node 405 of the voltage generation component. Accordingly, during the chirp phase 310 of the PLL 100, when both capacitances 462, 468 are coupled to the output node 405, the capacitance at the output node 405 comprises the combined capacitance of both capacitances 462, 468 (i.e. $C_1+C_2$).

Conversely, during a reset phase 320 of the PLL 100, the first control signal 472 may be set to open the coupling switch 464 to decouple the decouplable capacitance 462 from the output node 405 of the voltage generation component and the second control signal 474 may be set to close discharge switch 466 to create a discharge path across the decouplable capacitance 462. In this manner, during the reset phase 320 of the PLL 100, the decouplable capacitance 462 is decoupled from the output node 405 of the voltage generation component, and thus does not form a part of the load capacitance at the output node 405. Accordingly, during the reset phase 320 of the PLL 100, when only the fixed capacitance 468 is coupled to the output node 405, the capacitance at the output node 405 comprises just the fixed capacitance 468 (i.e. $C_2$). Furthermore, closing of the discharge switch 466 allows the decouplable capacitance 462 to be discharged there through during the reset phase 320. In this manner, only the fixed capacitance 468 need be discharge through the PLL 100.

Thus, the DAC component 44 illustrated in FIG. 4 comprises a configurable capacitive load component 460 coupled to the output node 405 of the voltage generation component. In particular, the capacitive load component 460 is configurable during, for example, a chirp phase 310 to comprise a first (higher) capacitive load. As outlined above, by providing a higher capacitive load at the output of the DAC component 44, a narrower filtering bandwidth can be provided during the chirp phase 310, reducing the noise contribution of the DAC component 44. The capacitive load component 460 is further configurable during, for example, a reset phase 430 to comprise a second (lower) capacitive load. Accordingly, by providing a lower capacitive load at the output of the DAC component 44, an improved settling time for the signal output by the DAC component 44 (e.g. a faster settling time for the reset step between chirp phases of the chirp signal).

Figure 5:
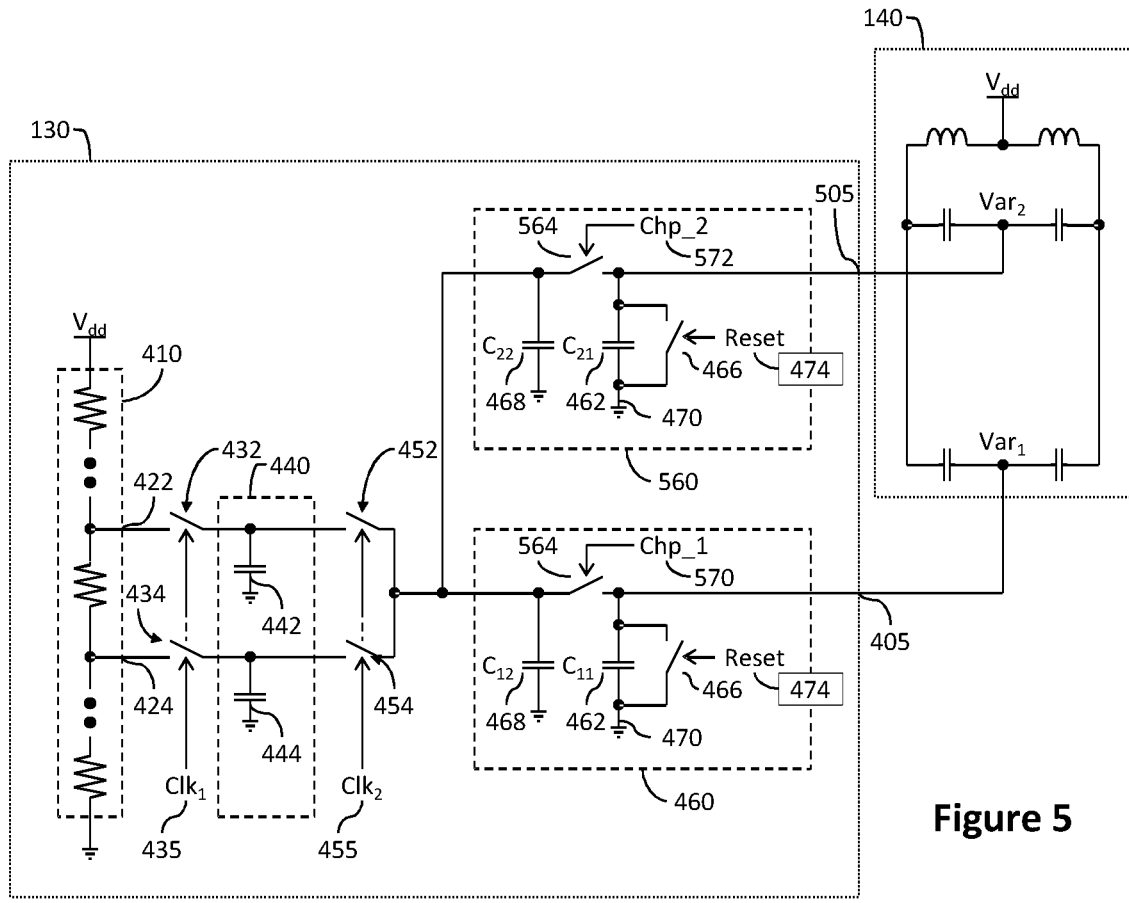
FIG. 5 schematically illustrates a simplified circuit diagram of a part of an alternative example embodiment of a capacitive load component of the DAC component of FIG. 4.

FIG. 5 schematically illustrates a simplified circuit diagram of a part of an alternative example embodiment of a capacitive load component 460 of the DAC component 44 of FIG. 4. In the example embodiment illustrated in FIG. 5, the VCO component 42 comprises two control terminals, and the DAC component 44 comprises a first configurable capacitive load component 460 coupled between the output node 405 of the voltage generation component and the first control terminal of the VCO component 42 and a second configurable capacitive load component 560 coupled between the output node 405 of the voltage generation component and the second control terminal of the VCO component 42. In this manner, the DAC component 44 is arranged to provide control signals to multiple control terminals of the VCO component 42, in order to enable a larger chirp dynamic range to be achieved for a given supply voltage range.

In the example illustrated in FIG. 5, the second terminal of the decouplable capacitance 462 in each configurable capacitive load component 460, 560 is coupled to the respective control terminal of the VCO component 42 such that the coupling switch 564 is coupled between the output node 405 of the voltage generation component and the respective control terminal of the VCO component 42 such that when the coupling switch 564 is controlled to decouple the output node 405 of the voltage generation component from the second terminal of the decouplable capacitance 462, the decouplable capacitance 462 remains coupled to the respective control terminal of the VCO component 42, thereby maintaining the control voltage at the respective control terminal. Furthermore, when the discharge switch 466 is closed to discharge the respective decouplable capacitance 462, the discharge switch 466 also provides a discharge path for a varactor within the VCO component 42 coupled to the respective control terminal, thereby providing a fast discharge of not just the decouplable capacitance, but also of the respective VCO varactor coupled thereto.

Referring back to FIG. 1, during the reset phase of a chirp signal, the output frequency of the digitally controlled oscillator is required to make a large step in a short period of time. Such a large step in such a short period of time would typically cause the PLL 100 to loose lock. For the PLL 100 to remain in lock during the reset phase the frequency of the reset state of the (or each) control terminal of the VCO component 42 is required to be known, in order to control the divider 14 during the reset phase.

Figure 6:
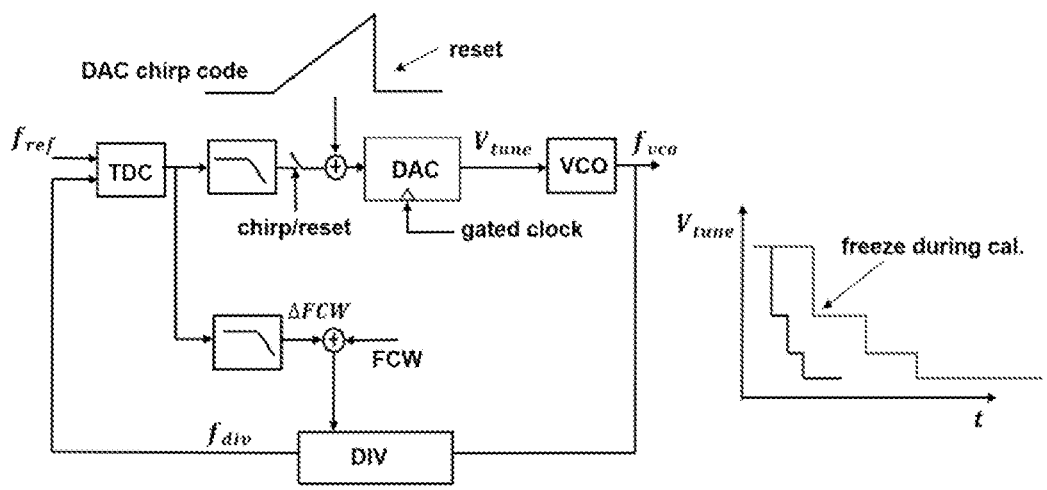
FIG. 6 schematically illustrates a simplified circuit diagram of an alternative example embodiment of a DAC component.

Referring now to FIG. 6, there is illustrated a simplified schematic diagram showing a method of calibrating a nonlinearity of the VCO component 42 of the digitally controlled oscillator herein before described. The method comprises, for each control terminal of the VCO component 42, configuring the digitally controlled oscillator into a reset state for the respective control terminal, for example by way of appropriate gating of a clock signal provided to the DAC component 44 during a reset phase. Calibration of the VCO component 42 is then performed to determine an output frequency of the digitally controlled oscillator with the digitally controlled oscillator configured in the reset state for the respective control terminal. For example, and as illustrated in FIG. 6, such calibration may be performed using the PLL 100. A VCO frequency control configuration for the reset state of the respective control terminal is then determined, for example for configuring the divider 14 to achieve the required output frequency of the digitally controlled oscillator during the reset state of the respective control terminal. The determined frequency control configuration is then stored for use during the chirp phase of signal generation. Such a process may be performed for each control terminal of the VCO component 42.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A digitally controlled oscillator comprising a filtering digital to analogue converter (DAC) component and a voltage controlled oscillator (VCO) component comprising at least one control terminal arranged to receive a control voltage output by the DAC component, wherein the DAC component comprises a voltage generation component arranged to generate the control voltage and at least one configurable capacitive load component to which the control voltage is applied such that a filtering bandwidth of the DAC component is configurable by way of the at least one configurable capacitive load component.

2. The digitally controlled oscillator of claim 1, wherein the at least one configurable capacitive load component comprises:
- a decouplable capacitance comprising a first terminal coupled to a reference voltage node,
- a coupling switch coupled in series with the decouplable capacitance between an output node of the voltage generation component and a second terminal of the decouplable capacitance, and
- a discharge switch coupled in parallel with the decouplable capacitance;
- wherein the coupling switch is controllable via a first control signal to selectively couple the output node of the voltage generation component to the second terminal of the decouplable capacitance and the at least one control terminal of the VCO component, and the discharge switch is controllable via a second control signal to selectively create a discharge path between the first and second terminals of the decouplable capacitance.

3. The digitally controlled oscillator of claim 2, wherein the at least one configurable capacitive load component further comprises at least one fixed capacitance comprising a first terminal coupled to the reference voltage node and a second terminal coupled to the output node of the voltage generation component.

4. The digitally controlled oscillator of claim 2, wherein the second terminal of the decouplable capacitance is coupled to the at least one control terminal of the VCO component such that the coupling switch is coupled between the output node of the voltage generation component and the at least one control terminal of the VCO component such that when the coupling switch is controlled to decouple the output node of the voltage generation component from the second terminal of the decouplable capacitance, the decouplable capacitance remains coupled to the at least one control terminal of the VCO component.

5. The digitally controlled oscillator of claim 2, wherein the VCO component comprises a first control terminal and at least one further control terminal, and the DAC component comprises a first configurable capacitive load component coupled between the output node of the voltage generation component and the first control terminal of the VCO component and a at least one further configurable capacitive load component coupled between the output node of the voltage generation component and the at least one further control terminal of the VCO component.

6. A frequency-modulated continuous-wave radar system comprising a digitally controlled oscillator according to claim 1.

7. The frequency-modulated continuous-wave radar system of claim 6, wherein the digitally controlled oscillator is arranged to generate a chirp signal.

8. The frequency-modulated continuous-wave radar system of claim 7, wherein during a chirp phase of the chirp signal, the at least one configurable capacitive load component is configured to reduce the filtering bandwidth of the DAC component.

9. The frequency-modulated continuous-wave radar system of claim 8, wherein during a reset phase of the chirp signal, the at least one configurable capacitive load component is configured to increase the filtering bandwidth of the DAC component.

10. The frequency-modulated continuous-wave radar system of claim 9, wherein during a reset phase of the chirp signal, the at least a part of the configurable capacitive load component is discharged.

11. The frequency-modulated continuous-wave radar system of claims 6, wherein the digitally controlled oscillator forms part of a phase-locked loop.

12. A method of calibrating a nonlinearity of the VCO component of the digitally controlled oscillator of claim 1; the method comprising for each control terminal of the VCO component:
- configuring the digitally controlled oscillator into a reset state for the respective control terminal;
- performing calibration of the VCO to determine an output frequency of the digitally controlled oscillator with the digitally controlled oscillator configured in the reset state for the respective control terminal;
- determining a VCO frequency control configuration for the reset state for the respective control terminal; and
- storing the determined frequency control configuration for use during chirp signal generation.

13. The method of claim 12, wherein the method comprising calibrating the nonlinearity of the VCO component for each control terminal in a given sequence.

* * * * *